(12) United States Patent
Li (10) Patent No.: US 9,178,090 B2
(45) Date of Patent: Nov. 3, 2015

(54) REACTION APPARATUS AND METHOD FOR MANUFACTURING A CIGS ABSORBER OF A THIN FILM SOLAR CELL

(71) Applicant: Delin Li, San Jose, CA (US)

(72) Inventor: Delin Li, San Jose, CA (US)

(73) Assignee: Soltrium Technology, LTD., Shenzhen (CN)

( * ) Notice: Subject to any disclaimer, the term of this patent is extended or adjusted under 35 U.S.C. 154(b) by 138 days.

(21) Appl. No.: 13/941,012

(22) Filed: Jul. 12, 2013

(65) Prior Publication Data

US 2014/0141562 A1    May 22, 2014

(30) Foreign Application Priority Data

Nov. 22, 2012    (CN) .......................... 2012 1 0478386

(51) Int. Cl.
```
C23C 16/54       (2006.01)
H01L 21/67       (2006.01)
H01L 31/0392     (2006.01)
H01L 31/032      (2006.01)
C23C 16/455      (2006.01)
```
(52) U.S. Cl.
CPC ........ *H01L 31/03928* (2013.01); *C23C 16/545* (2013.01); *H01L 21/67155* (2013.01); *H01L 21/67161* (2013.01); *H01L 21/67173* (2013.01); *H01L 31/0322* (2013.01); *C23C 16/45561* (2013.01)

(58) Field of Classification Search
None
See application file for complete search history.

(56) References Cited

U.S. PATENT DOCUMENTS 4,485,125 A * 11/1984 Izu et al. .......................... 427/74
7,334,595 B2 * 2/2008 Birtcher et al. ............. 137/15.04

* cited by examiner

*Primary Examiner* — Karla Moore
(74) *Attorney, Agent, or Firm* — Fang Wu (57) ABSTRACT

The present invention provides an apparatus and a method for manufacturing a CIGS absorber of a thin film solar cell. The apparatus includes a supply chamber configured to provide a flexible substrate coated with precursors. The apparatus further includes a reaction chamber coupled to the supply chamber for at least subjecting the precursors on the flexible substrate to a reactive gas at a first state to form an absorber material. Additionally, the apparatus includes a gas-balancing chamber filled with the reactive gas at a second state. The gas-balancing chamber is communicated with the reaction chamber for automatically updating the first state of the reactive gas to the second state. Moreover, the apparatus includes a control system to maintain the second state of the reactive gas in the gas-balancing chamber at a preset condition and to adjust the transportation of the flexible substrate through the reaction chamber.

12 Claims, 7 Drawing Sheets

REACTION APPARATUS AND METHOD FOR MANUFACTURING A CIGS ABSORBER OF A THIN FILM SOLAR CELL

CROSS-REFERENCES TO RELATED APPLICATIONS

The subject matter of the present application is related to China Patent Application No. 201210478386.8, filed on Nov. 22, 2012, by Delin Li, commonly assigned and incorporated by reference herein to its entirety for all purposes.

BACKGROUND OF THE INVENTION

The present invention relates to the field of solar cell manufacturing, and particularly to a reaction apparatus and method for manufacturing a CIGS-based absorber of a thin film solar cell.

In recent years, people increasingly pay attention to issues of energy and environment, and the nuclear energy and the solar energy are the most prospective new energies to be developed. However, since nuclear leakage occurred in Japan, people begin to realize that the solar energy is the safest and the most environment-friendly new energy. A solar cell can directly convert sunlight into the electric energy. A solar cell is made of a semiconductor, and basically, when the sunlight irradiates the solar cell, a part of the sunlight is absorbed in the semiconductor material. Through a p-type semiconductor and an n-type semiconductor in the semiconductor material, electrons (negative) and electron holes (positive) are generated. The electrons are separated from the electron holes to form a voltage drop, and the energy stimulates the electrons to get rid of the constraint, so that the electrons flow freely. One or more electric fields exist in each solar cell, and an electron beam may be forcedly absorbed, released and flow in a certain direction. This electron beam current may be collected to the top and the bottom of a solar cell through metal contact, and then transmitted to a load through a lead. It means that the absorbed sunlight energy is converted into the semiconductor energy. Meanwhile, the current magnitude together with the voltage generated by the built-in electric field of the solar cell embodies the capacity of the solar cell.

In the conventional solar cell manufacturing, silicon is used as a monocrystal or polycrystal silicon chip which may absorb light. A wafer undergoes several process steps, and then is integrated to a module. The material and process costs of a crystalline silicon solar cell are high, so the manufacturing cost of a solar cell module is high. The technology of the thin film solar cell is greatly developed in the past thirty years, and the manufacturing cost thereof is lower than that of the crystalline silicon solar cell. Generally, the thickness of the semiconductor absorbing layer of the thin film solar cell is less than 1% of the thickness of the absorbing layer of the crystalline silicon cell, and the absorbing layer of the thin film solar cell is deposited on a substrate material with a relatively low cost, which is applicable to low-cost and mass production.

After development and evolution of the first generation monocrystal silicon solar cell, the second generation polycrystal silicon solar cell, and the non-crystalline silicon solar cell, the third generation thin film solar photovoltaic cell emerges. The CIGS-based thin film solar cell (a compound semiconductor formed of copper, indium, gallium, and selenium, and named as CIGS by taking initial letters of the four components) has advantages such as high light absorbing coefficient, high conversion efficiency, adjustable band gap, high stability, and strong anti-radiation capability, and is highlighted widely. In a lab, the conversion efficiency is up to more than 20%, and even the thin film with the thickness being 1 µm may obtain enormous electric energy production, so the CIGS-based thin film solar cell is currently a thin film photovoltaic cell with the highest conversion efficiency, and is honored by the industry as: a rising star of solar cell products.

The CIGS thin film is a composite semiconductor material as an absorber for absorbing sunlight, and includes some group-IB (copper, silver, and gold), group-IIIA (boron, aluminum, gallium, indium, and titanium) and group-VIA (oxygen, sulfur, selenium, tellurium, and polonium) elements.

However, existing reaction apparatus for preparation of the CIGS-based absorber often leads to poor stability of concentration and pressure of the gas in the reaction chamber, resulting in an uneven distribution of a CIGS thin film absorber material, substantially lower fabrication yield, and poorer energy conversion performance of the CIGS-based thin film solar cell. All these issues are adverse to mass production and popularization of the CIGS-based thin film solar technology.

From the above, it is seen that an improved apparatus and method for forming a CIGS absorber material in an reactive process is desired.

BRIEF SUMMARY OF THE INVENTION

The present invention is to provide a reaction apparatus for manufacturing an absorbing layer of a CIGS-based thin film solar cell, to solve the problem in the prior art that, when an absorbing layer of a CIGS-based thin film solar cell is manufactured, the thickness coverage is uneven, which seriously influences the fabrication yield of the CIGS-based thin film solar cell and is adverse to popularization.

In an embodiment, the present invention provides an apparatus for manufacturing a CIGS-based absorber material of a thin film solar cell. The apparatus includes a supply chamber configured to provide a flexible substrate having a surface region coated with one or more precursor materials. The apparatus further includes a reaction chamber coupled to the supply chamber for receiving and heating the flexible substrate in transportation, and subjecting the one or more precursor materials to a reactive gas at a first state to form an absorber material. Additionally, the apparatus includes a receiving chamber coupled to the reaction chamber for receiving the flexible substrate with the formed absorber material. Furthermore, the apparatus includes a gas-balancing chamber filled with the reactive gas at a second state. The gas-balancing chamber is communicated with the reaction chamber for automatically updating the first state of the reactive gas to the second state. Moreover, the apparatus includes a control system coupled at least to the reaction chamber and the gas-balancing chamber to maintain the second state of the reactive gas in the gas-balancing chamber at a preset condition and to adjust the transportation of the flexible substrate through the reaction chamber.

In a specific embodiment, the present invention provides an apparatus for manufacturing a CIGS-based absorber material of a thin film solar cell, the apparatus including a first plurality of sensor devices disposed in the gas-balancing chamber for providing feedback information for the control system to maintain the second state at a preset condition and a second plurality of sensor devices disposed in the reaction chamber for monitoring the first state being updated to the second state.

In another specific embodiment, the present invention provides an apparatus manufacturing a CIGS-based absorber material of a thin film solar cell, the apparatus including at least two pairs of auxiliary rollers for clamping and transporting the flexible substrate at two separate locations in the elongated channel to divide the reaction chamber sequentially into a pre-heating region, a reaction region, a cooling region.

In yet another specific embodiment, the present invention provides an apparatus manufacturing a CIGS-based absorber material of a thin film solar cell, the apparatus including a heating component including thermal insulation material configured to wrap around the pre-heating region, the reaction region of the reaction chamber, and the gas-balancing chamber, the pre-heating region being associated with a first temperature, the reaction region being associated with a second temperature, and the gas-balancing chamber being associated a third temperature, the second temperature being set to be greater than the first temperature with a step profile and substantially equal to the third temperature.

In yet still another specific embodiment, the present invention provides an apparatus manufacturing a CIGS-based absorber material of a thin film solar cell, the reaction chamber of the apparatus is an elongated channel configured to start from a horizontal portion of the pre-heating region, change to an ascending portion at a first turning position by a first angle, extend the ascending portion of the pre-heating region to an ascending portion of the reaction region up to an apex position, change the ascending portion of the reaction region to a descending portion of the reaction region at the apex position by a second angle, extend the descending portion of the reaction region to a descending portion of the cooling region, change the descending portion of the cooling region to a horizontal portion of the cooling region at a second turning position by a third angle. The first angle is set to a range from 0 degree up to 45 degrees. The second angle is substantially equal to 2× of the first angle. The third angle is substantially equal to the first angle.

In an alternative embodiment, the present invention provides a method for manufacturing a CIGS-based absorber of a thin film solar cell. The method includes providing a flexible substrate in a supply chamber as a wound roll. The flexible substrate is coated with precursor materials made by one of the following sequential layers: Cu/In/Ga/Se, Cu/In/Cu/Ga/Se, Cu—In alloy/Ga/Se, Cu—Ga alloy/In/Se, Cu/In—Ga alloy/Se, Cu/Ga/Cu/In/Se, Cu/Ga/In/Se, Cu—Ga alloy/Cu—In alloy/Se, Cu—Ga alloy/Cu—In alloy/Ga/Se, Cu/Cu—In alloy/Ga/Se, and Cu—Ga alloy/In/In—Ga alloy/Se. The method further includes providing a reaction chamber sequentially coupled between the supply chamber and a receiving chamber. The supply chamber, the reaction chamber, and the receiving chamber are respectively sealed hermetically and the reaction chamber is further divided into a pre-heating region, a reaction region, and a cooling region respectively sealed from each other. Additionally, the method includes providing a gas-balancing chamber coupled to the reaction region with a permeation communication and a common thermal control. The method further includes introducing a Se-bearing reactive gas respectively in each of the pre-heating region, the reaction region, the cooling region, and the gas-balancing chamber. Furthermore, the method includes unfolding the flexible substrate from the wound roll in the supply chamber to transport into the reaction chamber for at least subjecting the precursor materials to a selenization reaction with the Se-bearing reactive gas in the reaction region including additional Se vapor partially released from the precursor materials. The method further includes maintaining the Se-bearing reactive gas within the gas-balancing chamber at a predetermined state. The Se-bearing reactive gas including additional Se vapor in the reaction region is dynamically balanced at the same predetermined state by the permeation valve and the common thermal control during the selenization reaction to transform the precursor materials into a semiconductor absorber substantially uniformly on the flexible substrate that is continuously transported through the reaction region. Moreover, the method includes transporting the flexible substrate further out of the reaction region to the cooling region to cool the formed semiconductor absorber thereon and receiving the flexible substrate including the semiconductor absorber in the receiving chamber, the flexible substrate being wound into a roll.

In a specific embodiment, maintaining the Se-bearing reactive gas within the gas-balancing chamber at a predetermined state includes a step of maintaining a predetermined pressure using an inlet valve connected to a gas-source, an evacuation valve for exhausting extra gas, and optionally an outlet valve connected to a standby chamber and a step of maintaining a predetermined temperature using a heating component shared with the reaction region for the common thermal control. Each of these valves and the heating component are controlled by a control system assisted by feedback information received from a plurality of sensor devices disposed within the gas-balancing chamber.

BRIEF DESCRIPTION OF THE DRAWINGS

The present invention will become more fully understood from the detailed description given herein below for illustration only, and thus does not limit the present invention, and where.

LIST OF REFERENCE NUMERALS

| A | Feeding region | 201 | Substrate |
| --- | --- | --- | --- |
| B | Pre-heating region | 202 | Back electrode layer |
| C | Reaction region | 203 | Preset (precursor) layer |

-continued

| | | | |
|---|---|---|---|
| D | Cooling region | 204 | Absorbing layer |
| E | Material receiving region | 205 | Transition layer |
| 100A | Supply chamber | 206 | TCO layer |
| 100B | Reaction chamber | 207 | Upper electrode layer |
| 100C | Material receiving chamber | 109 | Regulating roller |
| 101 | Flexible substrate roll deposited with a preset (precursor) layer | 110A | Upper inlet transmission roller |
| | | 110B | Lower inlet transmission roller |
| 102 | Flexible substrate roll deposited with a CIGS absorbing layer | 111A | Upper outlet transmission roller |
| | | 111B | Lower outlet transmission roller |
| 103A | Supply cavity | 112A | Auxiliary roller located at the upper side of the reaction region inlet |
| 103B | Material receiving cavity | | |
| 104A | Supply chamber vacuum pipeline | | |
| 104B | Material receiving chamber vacuum pipeline | 112B | Auxiliary roller located at the lower side of the reaction region inlet |
| 1041, 1042 | Vacuum control valve | 112C | Auxiliary roller located at the upper side of the reaction region outlet |
| 105A | Supply chamber intake pipeline | | |
| 105B | Material receiving chamber intake pipeline | 112D | Auxiliary roller located at the lower side of the reaction region outlet |
| 1051, 1052 | Intake control valve | | |
| 106A | Pre-heating region intake pipeline | 113 | Gas-balancing chamber |
| 106B | Cooling region intake pipeline | 113A | Gas-balancing chamber evacuation valve |
| 1061, 1062, 1063 | Reactive gas control valve | | |
| | | 113B | Gas-balancing chamber outlet valve |
| 108 | Heating component | 114 | Standby chamber |
| P0 | Pressure in the reaction region | 114A | Standby chamber outlet valve |
| P1 | Pressure in the gas balancing chamber | 115A | Laminar substrate deposited with a preset (precursor) layer |
| P2 | Pressure in the Standby chamber | 115B | Laminar substrate deposited with a CIGS absorbing layer |
| 160 | Control system | | |
| 122 | Pressure sensor | 116 | Gas-balancing chamber intake pipeline |
| 131 | Temperature sensor | | |
| 133 | Composition sensor | 121 | Temperature sensor |
| | | 123 | Composition sensor |
| | | 132 | Pressure sensor |

DETAILED DESCRIPTION OF THE INVENTION

To make the objectives, technical solutions, and advantages of the present invention more comprehensible, the following further describes the present invention in detail with reference to the accompanying drawings and embodiments. It is understandable that the specific embodiments are only used to explain the present invention and are not intended to limit the present invention.

The CIGS thin film is one of thin film technologies, uses a composite semiconductor of group-IB, group-IIIA, and group-VIA chemical elements as an absorbing layer for absorbing sunlight, and includes some group-IB (copper, silver, and gold), group-IIIA (boron, aluminum, gallium, indium, and titanium) and group-VIA (oxygen, sulfur, selenium, tellurium, and polonium) substances or elements.

Figure 1:
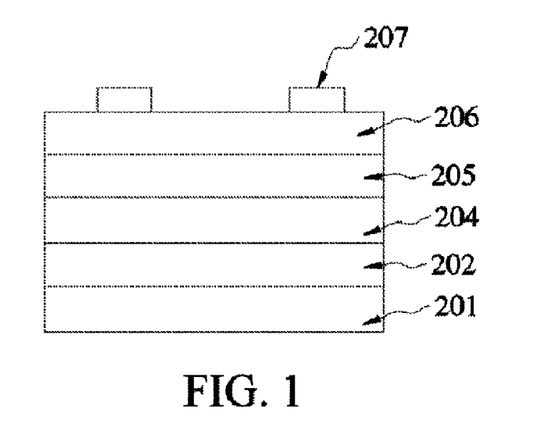
FIG. 1 is a schematic cross-sectional diagram of a CIGS-based thin film solar cell.

FIG. 1 shows one embodiment of a CIGS thin film solar cell sequentially includes the following components from the bottom to the top: a substrate 201, a back electrode layer 202, a semiconductor absorbing layer 204, a transition layer 205, a TCO layer (conductive oxide thin film layer) 206, and an upper electrode layer 207 deposited on the substrate 201. The substrate 201 is selected from one of the following group consisting of glass, metal foil, or plastic, the back electrode layer 202 is made of Mo or a Mo alloy, the semiconductor absorbing layer 204 is mainly formed of a CIGS compound such as $Cu(InGa)Se_2$, the transition layer 205 is generally made of CdS or ZnS, the TCO layer 206 is made of i-ZnO and n-ZnO:Al, and the upper electrode layer 207 is made of a conductive substance such as Ni/Al, silver, or copper.

Figure 2A:
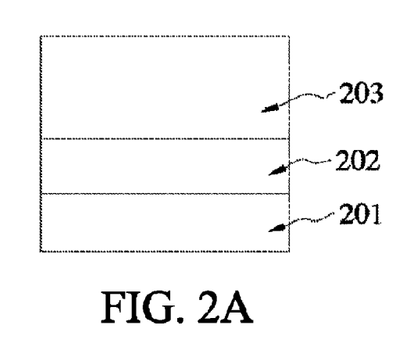
FIG. 2A is a schematic cross-sectional diagram of a flexible substrate deposited with a preset layer or precursor layer.
Figure 2B:
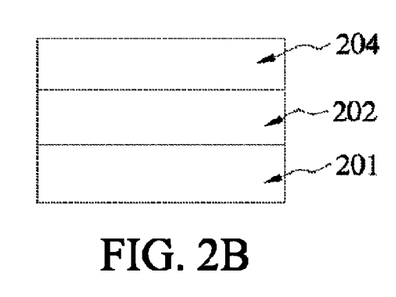
FIG. 2B is a schematic cross-sectional diagram of a flexible substrate having a CIGS-based semiconductor absorber layer.

The semiconductor absorbing layer 204 is the core part of the CIGS-based solar cell, and is generally formed of elements including group-IB elements, group-IIIA elements, and group-VIA elements, for example, made of an alloy of copper and indium and/or selenium, or an alloy of aluminum and selenium and/or sulfur. There are many CIGS absorber preparation methods, such as a vacuum sputtering method, a vacuum evaporation method, a molecular beam epitaxy method, and an electrochemical deposition method. At present, technically, a method for performing a selenization reaction after a preset (precursor) layer of metal materials is deposited is mature. As shown in FIG. 2A, generally a layer of back contact electrode 202 and a preset layer of metal materials 203 are pre-deposited on a flexible substrate 201. The preset layer of metal materials 203 includes metals from group-IB elements, group-IIIA elements, and group-VIA elements and other metal additives or dopants. The flexible substrate 201 including the deposited preset layer of metal materials 203 is fed into a reaction apparatus filled with reactive gas including selenium or sulfur for transforming the preset layer of metal materials into an absorbing layer by performing a selenization reaction in the reaction apparatus. The reaction results in the semiconductor absorbing layer 204 as shown in FIG. 2B.

Embodiments of the present invention is to provide one or more reaction apparatus and methods for manufacturing a CIGS-based thin-film absorber material. The detail descriptions of these embodiments are given below with reference to accompanying exemplary drawings.

FIGS. 3 through 8 show several embodiments of a reaction apparatus for manufacturing an absorbing layer of a CIGS-based thin film solar cell.

Embodiment 1

Figure 3:
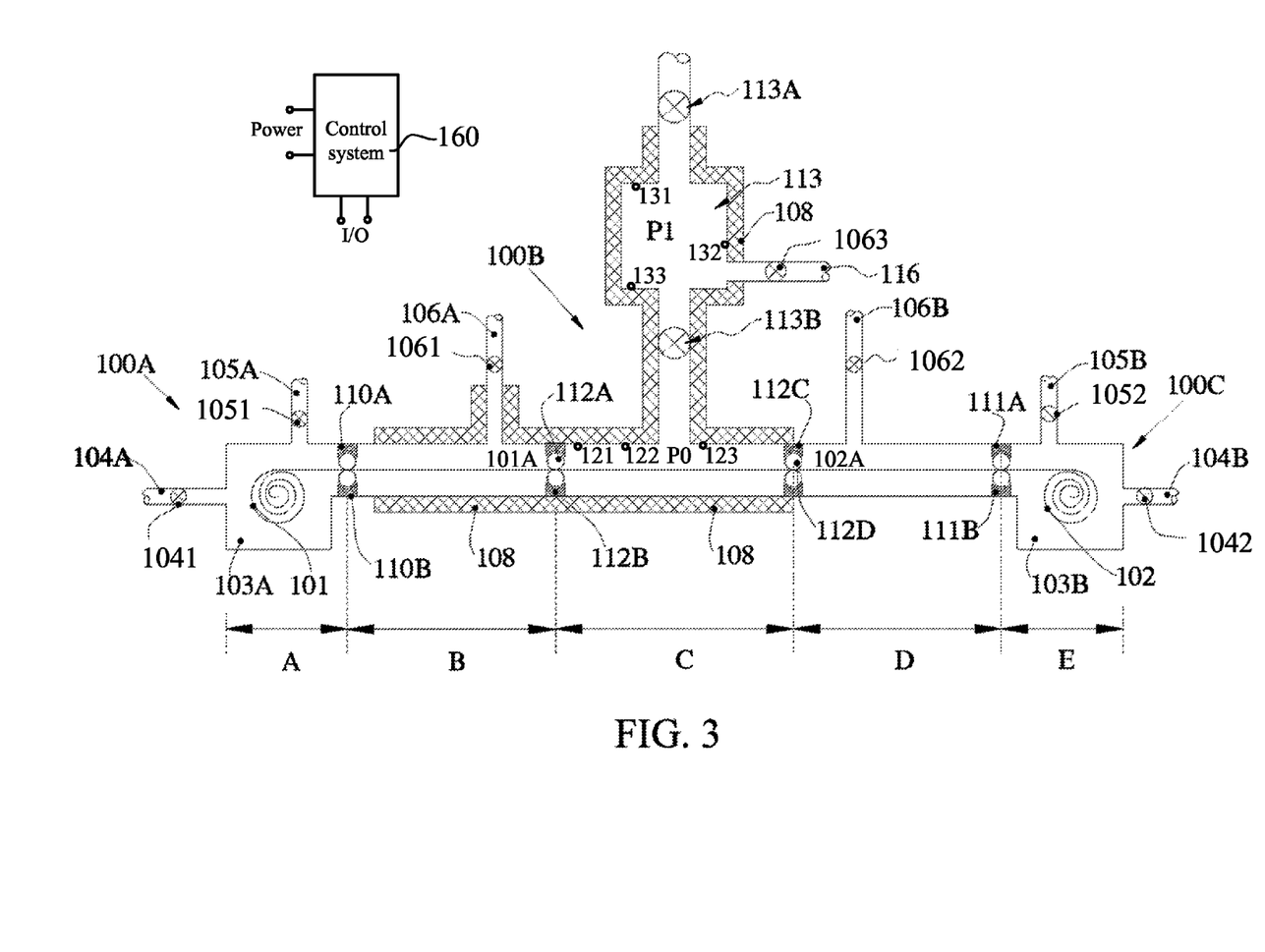
FIG. 3 is a schematic diagram of a reaction apparatus for manufacturing an absorbing layer of a CIGS-based thin film solar cell provided in Embodiment 1 of the present invention.

FIG. 3 is a schematic diagram of a reaction apparatus for manufacturing a CIGS absorber material of a thin film solar cell provided in Embodiment 1 of the present invention.

The reaction apparatus for manufacturing a CIGS absorber material of a thin film solar cell includes a control system 160, and a supply chamber 100A, a reaction chamber 100B and a material receiving chamber 100C in communication with each other. The entire apparatus is divided into five regions, which are sequentially a feeding region A, a pre-heating region B, a reaction region C, a cooling region D, and a material receiving region E.

The supply chamber 100A is located in the feeding region A, and has a sealable supply cavity 103A. A preset layer is deposited on a flexible substrate used for manufacturing a CIGS-based thin film absorber material, and the flexible substrate is mounted in the supply cavity 103A in a winding manner. For the convenience of illustrating distinction from the subsequent flexible substrate deposited with the absorbing layer, herein the flexible substrate mounted in the supply cavity 103A is referred to as a flexible substrate roll 101 deposited with a preset layer containing elements Cu, In, Ga and Se. In actual production, the flexible substrate may be made of the following materials: aluminum foil, stainless steel foil, titanium foil, molybdenum foil, steel strip, polyimide film, PET film, poly-tetrafluoroethylene film, PEN film, brass foil, and polyester thin film. The preset layer may be deposited on the flexible substrate through a sputtering process, a thermal evaporation process, an electroplating process and/or an ink printing process. The flexible substrate rolling in the reaction chamber 100B is referred to as a flexible substrate roll 102 deposited with the absorbing layer. The flexible substrate roll 101 deposited with the preset layer is unfolded and fed out from an outlet end of the supply cavity 103A, so as to enter the reaction chamber 100B.

The reaction chamber 100B has a sealable reaction channel including the pre-heating region B, the reaction region C and the cooling region D sequentially laid out along the direction that the flexible substrate passes forward. The reaction channel is formed by enclosing of a top wall, a bottom wall and two side walls connected to the top wall and the bottom wall. The top wall and the bottom wall are substantially larger in dimension than the side walls. The side wall dimension, i.e., the height from the bottom wall to the top wall, is only in a range from 3 mm to 12 mm. It is designed so that a volume of the reaction channel for the flexible substrate roll 101 deposited with the preset layer to pass through is reduced as much as possible for accommodating the reactive gas within. When the flexible substrate roll 101 deposited with the preset layer passes through the reaction channel, the preset layer is subject to a selenization reaction, so as to prepare a CIGS-based semiconductor absorber. Preferably, the cross section of the reaction channel is rectangular or oval, and the entire reaction channel is in the shape of a narrow slit. In actual production, according to the movement speed and the predetermined temperature curve of the flexible substrate in the reaction chamber, the temperature and the time of the flexible substrate in the reaction chamber 100B are set.

The material receiving chamber 100C is located in the material receiving region E, and has a sealable material receiving cavity 103B, for receiving the flexible substrate roll 102 deposited with the absorbing layer.

The control system 160 is configured to communicate with a plurality of sensor devices disposed in the reaction chamber 100B and in a gas-balancing chamber 113 coupled to the reaction chamber 100B. The control system 160 is also configured to operate a plurality of valves connected to the reaction apparatus using both predetermined process parameters and real-time information collected from the plurality of sensor devices. The plurality of valves are respectively disposed on a gas pipeline communicated to the supply chamber 100A, the reaction chamber 100B, and the material receiving chamber 100C, as well as the gas-balancing chamber 113 to control in-and-out of relevant gas (or gases). The plurality of sensor devices can detect the state of gas (gases) in the supply chamber 100A, the reaction chamber 100B, and the material receiving chamber 100C, and particularly, the gas-balancing chamber 113 that is coupled to the reaction chamber 100B.

An outlet end of the supply cavity 103A is connected to an inlet end of the reaction channel, an inlet end of the material receiving cavity 103B is connected to an outlet end of the reaction channel, and the supply cavity 103A, the reaction channel and the material receiving cavity 103B are sequentially communicated to form a sealed space.

The supply cavity 103A of the supply chamber 100A is separately in communication with a supply chamber vacuum pipeline 104A and a supply chamber intake pipeline 105A, a vacuum control valve 1041 is disposed on the supply chamber vacuum pipeline 104A, and an air intake control valve 1051 is disposed on the supply chamber intake pipeline 105A. The supply chamber vacuum pipeline 104A is connected to a vacuum pump (not shown).

The material receiving cavity 103B of the material receiving chamber 100C is separately in communication with a vacuum pipeline 104B and an intake pipeline 105B. The vacuum control valve 1042 is disposed in the vacuum pipeline 104B, and the intake control valve 1052 is disposed in the intake pipeline 105B. The vacuum pipeline 104B is also connected to the vacuum pump. A sealed space is formed throughout the supply cavity 103A, the reaction channel and the material receiving cavity 103B and is vacuumized by opening the vacuum control valves 1041 and 1042. Reactive gas may be injected into the supply cavity 103A and the material receiving cavity 103B respectively through the intake control valve 1051 and the intake control valve 1052.

The pre-heating region B and the cooling region D of the reaction chamber 100B are respectively connected with a pre-heating region intake pipeline 106A and a cooling region intake pipeline 106B. A reactive gas control valve 1061, 1062 is disposed respectively in the pre-heating region intake pipeline 106A and the cooling region intake pipeline 106B. Inert gas or group-VIA element gas may be introduced into the pre-heating region B by opening the reactive gas control valve 1061.

It should be noted that, the group-VIA element gas such as Se-bearing gas or S-bearing gas is corrosive. Therefore, attention should be paid on material selection for the part in the reaction chamber 100B contacting the group-VIA chemical element, namely, the reaction channel. Preferably, the reaction channel is made of a high-temperature and corrosion resisting material, such as ceramic, glass, crystal, stainless steel and graphite material. The inner surface of the reaction channel is coated with a high-temperature-and-corrosion-resisting material such as silicon nitride.

The reaction region C of the reaction chamber 100B is hermetically connected with a gas-balancing chamber 113 (mentioned earlier) in such a way that the state of reactive gas in the reaction region C can be dynamically regulated. The gas-balancing chamber 113 is filled with the reactive gas used for forming the semiconductor absorbing layer. The reactive gas in this embodiment includes $H_2Se$ or $H_2S$ or a mixture of $H_2Se$ and $H_2S$ or Se. Preferably, the gas-balancing chamber 113 is perpendicularly connected to the reaction area. In this way, gravity effect is utilized to help the pressure drop of the reactive gas in the gas-balancing chamber 113 to be reduced to the maximum extent.

An outlet valve 113B is disposed on a pipeline connected to the gas-balancing chamber 113 through which the gas-balancing chamber 113 is communicated with the reaction region C within the reaction channel. The outlet valve 113B of the gas-balancing chamber 113 is a diaphragm type so that the reactive gas passes through the outlet valve 113B in a permeation manner from either side to another side. The outlet valve 113B enables both the gas-balancing chamber 113 and the reaction region C to maintain a dynamic balance of the reactive gas. In an embodiment, if the gas pressure P0 in the reaction region C is higher than the gas pressure P1 in the gas-balancing chamber 113, the outlet valve 113B is automatically opened to allow the reactive gas flowing from the reaction region C into the gas-balancing chamber 113; on the contrary when P1 is greater than P0, the outlet valve 113B also automatically allows the reactive gas flowing from the gas-balancing chamber 113 into the reaction region C to maintain the balance. The other end of the gas-balancing chamber 113 is provided with an exhaust channel having an evacuation valve 113A. Preferably, the exhaust channel is disposed on top region of the gas-balancing chamber 113 and can be connected to a gas-recycle system (not shown in FIG. 3). Therefore the extra reactive gas may be discharged from the top region of the gas-balancing chamber 113 through the evacuation valve 113A. The discharged reactive gas may be stored and recovered for reapplying to the reaction process or for other usages. The gas-balancing chamber 113 can be cleaned by purging inert gas through the evacuation valve 113A. When the gas pressure P1 in the gas-balancing chamber 113 is higher than a preset pressure value, the evacuation valve 113A is automatically opened by the control system 160 so as to release gas out of the gas-balancing chamber 113. In another embodiment, the gas-balancing chamber 113 is further connected to an air intake pipeline 116 through a reactive gas control valve 1063. The air intake pipeline 116 supplies the reactive gas from a gas source into the gas-balancing chamber 113 in advance by opening the reactive gas control valve 1063. Again, the control valve 1063 is controlled by the control system 160 using information collected at least by a pressure sensor 132 disposed in the gas-balancing chamber 113 to compare with the preset pressure value (can be pre-stored in the control system 160) to determine the value of the gas pressure P1.

In a specific embodiment, as the flexible substrate go through the selenization reaction apparatus, the preset layer of metal materials 203 containing Cu, In, Ga, Se elements in FIG. 2 disposed on the surface region of the flexible substrate forms a semiconductor absorbing layer 204 shown in FIG. 1. The formed semiconductor absorber layer 204 contains Cu, In, Ga Se, and/or S elements. Preferably, the reaction temperature is controlled within a range from 350° C. to 650° C. Depending on embodiments, the reaction time varies from several minutes to several hours. When the preset layer of metal materials 203 reacts with the Se-bearing reactive gas in the reaction chamber 100B, solid phase selenium element existed in the preset layer 203 is also partially converted into a gas-phase Se element. The Se element in the Se-bearing reactive gas as well as the released gas-phase Se element reacts with other metal elements such as Cu, In, and Ga in the preset layer 203. If the preset layer 203 generates excessive selenium gas, the pressure of the selenium gas in the reaction chamber 100B rises. As a result, the gas-balancing chamber air outlet valve 113B automatically opens to allow surplus Se-bearing reactive gas flowing into the gas-balancing chamber 113 to maintain the pressure P0 in the reaction chamber substantially at the preset value defined for the pressure P1. On the contrary, the reactive gas flows from the gas-balancing chamber 113 into the reaction chamber 100B to make up the shortage of Se-bearing reactive gas during its reaction with the metal elements Cu, In and Ga. In this way, the gas-balancing chamber 113 dynamically regulates the reactive gas in the reaction chamber 100B so that the reactive gas in the reaction chamber 100B is maintained in a predetermined optimal reaction state. The optimum reaction state, with a gas pressure P0 (substantially equals to P1) being well controlled to a preset value and a temperature being controlled within a desired range, thereby ensures that the selenization process parameters are substantially uniform throughout the entire reaction region C to facilitate the formation of a uniform film of CIGS absorber material on the continuously moving flexible substrate. The embodiments of the present invention as described above substantially improve the quality of the thin film solar cell, which is beneficial to large-scale production of low cost solar cell and popularization of clean solar energy application.

In a specific embodiment, a ratio of the volume of the gas-balancing chamber 113 to that of the reaction region C ranges from 1:10 to 10:1. If the gas-balancing chamber 113 is larger than the reaction region C, then the gas pressure in both the reaction region C and the gas-balancing chamber 113 is more stable with less variation. Moreover, if the gas-balancing chamber 113 is smaller than the reaction region C, storage quantity of the reactive gas in the gas-balancing chamber 113 can be reduced, thereby saving the cost.

In another specific embodiment, the inlet end and the outlet end of the reaction region C are respectively disposed with inlet transmission rollers 112A, 112B and outlet transmission rollers 112C, 112D capable of being used for regulating or supporting the flexible substrate and also capable of sealing the reaction channel within the reaction region C (for example, see FIG. 3).

As an example shown in FIG. 3, the inlet transmission rollers 112A, 112B and the outlet transmission rollers 112C, 112D are disposed in pairs. An upper inlet transmission roller 110A and a lower inlet transmission roller 110B of the reaction chamber 100B are matched into a pair. The flexible substrate (101A) passes through between the upper inlet transmission roller 110A and the lower inlet transmission roller 110B, and respectively presses against the upper inlet transmission roller 110A and the lower inlet transmission roller 110B. The upper inlet transmission roller 110A and the lower inlet transmission roller 110B rotate relative to each other, and respectively act on the upper surface and the lower surface of the flexible substrate (101A), to generate a friction force for driving the flexible substrate to advance. The friction or clamping force drives the flexible substrate 101A continuously out of the supply chamber 100A by unfolding a roll of consecutive flexible substrate 101 and ensures the flexible substrate continuously pass through the reaction channel. Likewise, the upper outlet transmission roller 111A and the lower outlet transmission roller 111B rotate relative to each other, to ensure that the flexible substrate (102A) continuously moves out of the reaction channel and enters the material receiving chamber 100C before being folded into another roll of the consecutive flexible substrate 102.

In yet another embodiment, the inlet transmission rollers 110A, 110B and the outlet transmission rollers 111A, 111B are respectively connected with an inlet driving element and an outlet driving element (not shown) capable of driving the respective rollers to rotate. Both the inlet driving element and the outlet driving element are controlled by the control system 160. According to certain production requirements such as thickness variation of the flexible substrate, the clamping force and the moving speed of the flexible substrate (101A or 102A) may be changed by the control system 160 to adjust the inlet driving element and the outlet driving element simultaneously for regulating the rotation speeds of the upper roller 11 OA and the lower roller 110B and relative separation. Synchronously via the control system 160, the upper outlet transmission roller 111A and the lower outlet transmission roller 111B can be correspondingly adjusted. Therefore, the applicability of the thin-film processing apparatus is improved, thin film solar cells of various specifications and sizes can be produced and machined, and meanwhile, automation can be easily implemented.

Further, more auxiliary rollers 112A, 112B, 112C and 112D are further disposed in pairs for clamping corresponding sections of the moving flexible substrate and enabling a smooth transportation of the flexible substrate through the reaction channel. Each pair of auxiliary rollers, 112A and 112B, or 112C and 112D, is symmetrically distributed at two sides of a junction region where the gas-balancing chamber 113 is connected to the reaction region C of the reaction channel. The flexible substrate passes through the central slit of each pair of auxiliary rollers, in which the flexible substrate respectively presses against the upper auxiliary roller 112A and the lower auxiliary roller 112B and presses against the upper auxiliary roller 112C and the lower auxiliary roller 112D. Generally, the auxiliary rollers 112A, 112B, 112C and 112D only rotate passively with the rotation of the inlet transmission rollers 110A, 110B and the outlet transmission rollers 111A, 111B while providing a supporting force to the flexible substrate to prevent the flexible substrate from crumpling and to ensure the evenness of the flexible substrate during transmission.

A first pair of auxiliary rollers 112A and 112B is disposed to separate the reaction region C and the pre-heating region B of the reaction channel. A second pair of auxiliary rollers 112C and 112D is disposed to separate the reaction region C and the cooling region D of the reaction channel. In this way, when it is required to supplement reactive gas into the reaction region C, the reactive gas permeates through the air outlet valve 113B of the gas-balancing chamber 113 and enters the reaction region C of the reaction channel, but the reactive gas is substantially prevented from diffusing into the pre-heating region B and the cooling region D respectively by the first pair of auxiliary rollers 112A and 112B and the second pair of auxiliary rollers 112C and 112D tightly pressing against the moving flexible substrate. Substantially free from any leaking pathway, the reaction region C is quickly regulated into a preset state with the reactive gas at desired pressure, temperature, and Se-composition for forming the semiconductor absorber material. Therefore, the structural layout associated with the two pairs of auxiliary rollers helps to improve sensitivity of the dynamic regulation of the gas-balancing chamber. If necessary, additional pairs of rollers can be included. In actual production, the number of pairs and interval positions of these auxiliary rollers can be reasonably set or adjusted according to the length of the reaction region C of the reaction channel. Alternatively, each pair of the auxiliary rollers is configured to be directly connected to the driving elements for better control of the transportation of the flexible substrate.

In a specific embodiment, the pre-heating region B and the reaction region C of the reaction chamber 100B as well as the periphery of the gas-balancing chamber 113 are wrapped with a heating component 108 including a thermal insulation material. Preferably, the thermal insulation material is made by ceramic wool. The heating component 108 includes wired thermocouple electrical-heating elements. In an embodiment, the heating component 108 is configured to be multiple zone heaters which independently set each of the pre-heating region B, the reaction region C and the cooling region D in the reaction chamber 100B at a different but a substantially uniform temperature with a step-like change from one region to another. In an example, a first temperature set in the pre-heating region B is lower than a second temperature set in the reaction region C. A third temperature set in the cooling region D is near the room temperature and substantially lower than the second temperature set in the reaction region C. Meanwhile, the heating component 108 also include a separate zone heater for ensuring that the temperature of reactive gas in the gas-balancing chamber 113 is substantially same as that near the flexible substrate in the reaction region C of the reaction channel. In an embodiment, the temperature near the flexible substrate is preferably set to be a predetermined value between 350° C. and 600° C. In a specific embodiment, the control system 160 is utilized for controlling the zone heaters of the heating component 108 for supporting the dynamic gas-state balancing between the reaction region C and the gas-balancing chamber 113.

In an alternative embodiment, the thermal insulation material associated with the heating component 108 substantially prevents heat within the pre-heating region B, the reaction region C, and the gas-balancing chamber 113 from dissipating easily to environment. Thermal insulation effect associated with the pre-heating region B, the reaction region C and the gas-balancing chamber 113 can preserve the heat relatively well to avoid extensive and repetitive heating processes so as to reduce the energy consumption and cost.

In a specific embodiment, the plurality of sensor devices communicating with the control system 160 includes at least a temperature sensor 121 for detecting temperature of the reactive gas in the reaction region C near the flexible substrate, a concentration detector 122 capable of detecting concentration of Se gas in the reaction channel, and a pressure sensor 123 capable of detecting the gas pressure in the reaction channel. Additionally, the plurality of sensor devices also include at least a temperature sensor 131, a concentration sensor 132, and a gas pressure sensor 133 disposed in the gas-balancing chamber 113 to provide corresponding sensing information for the control system 160 to adjust the heating component 108 and relevant gas valves communicating with the gas-balancing chamber to preserve the state of the gas-balancing chamber at the preset state for the reactive gas therein. Utilizing the plurality of sensor devices, the temperature, pressure, and concentration parameters of the reactive gas in the reaction region C can be monitored and updated in real time based on the state of the gas-balancing chamber 113 set by the control system 160. Subsequently, the reactive gas in the reaction region C is substantially stably controlled, uniformly maintained at a desired state in real time so that the selenization reaction between the reactive gas with the metal elements within the preset (precursor) layer 203 (FIG. 2A) would be carried out to produce a substantially uniform film of semiconductor absorber material 204 (see FIG. 2B).

Embodiment 2

Figure 4:
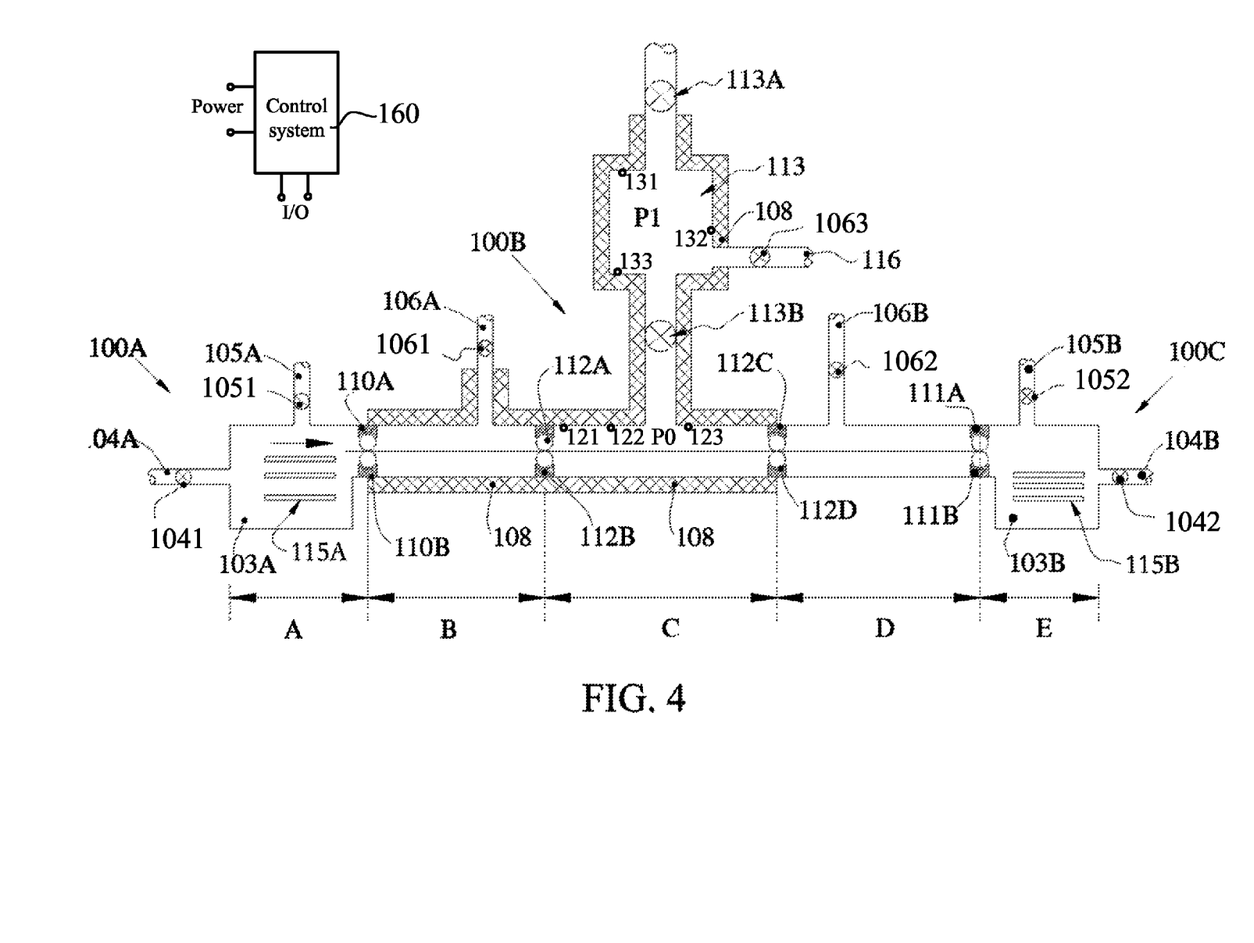
FIG. 4 is a schematic diagram of a reaction apparatus for manufacturing an absorbing layer of a CIGS-based thin film solar cell provided in Embodiment 2 of the present invention.

This embodiment differs from Embodiment 1 by some features described in FIG. 4. As shown in FIG. 4, a reaction apparatus is provided for manufacturing a CIGS absorbing material of a thin film solar cell by means of processing in batches. A laminar substrate 115A deposited with a preset layer is fed and supplied by the supply chamber 100A and transmitted by a conveying belt, an absorbing layer is deposited through the reaction channel in the reaction chamber 100B, and a laminar substrate 115B formed with an absorber material is received in the material receiving chamber 100C.

Embodiment 3

Figure 5:
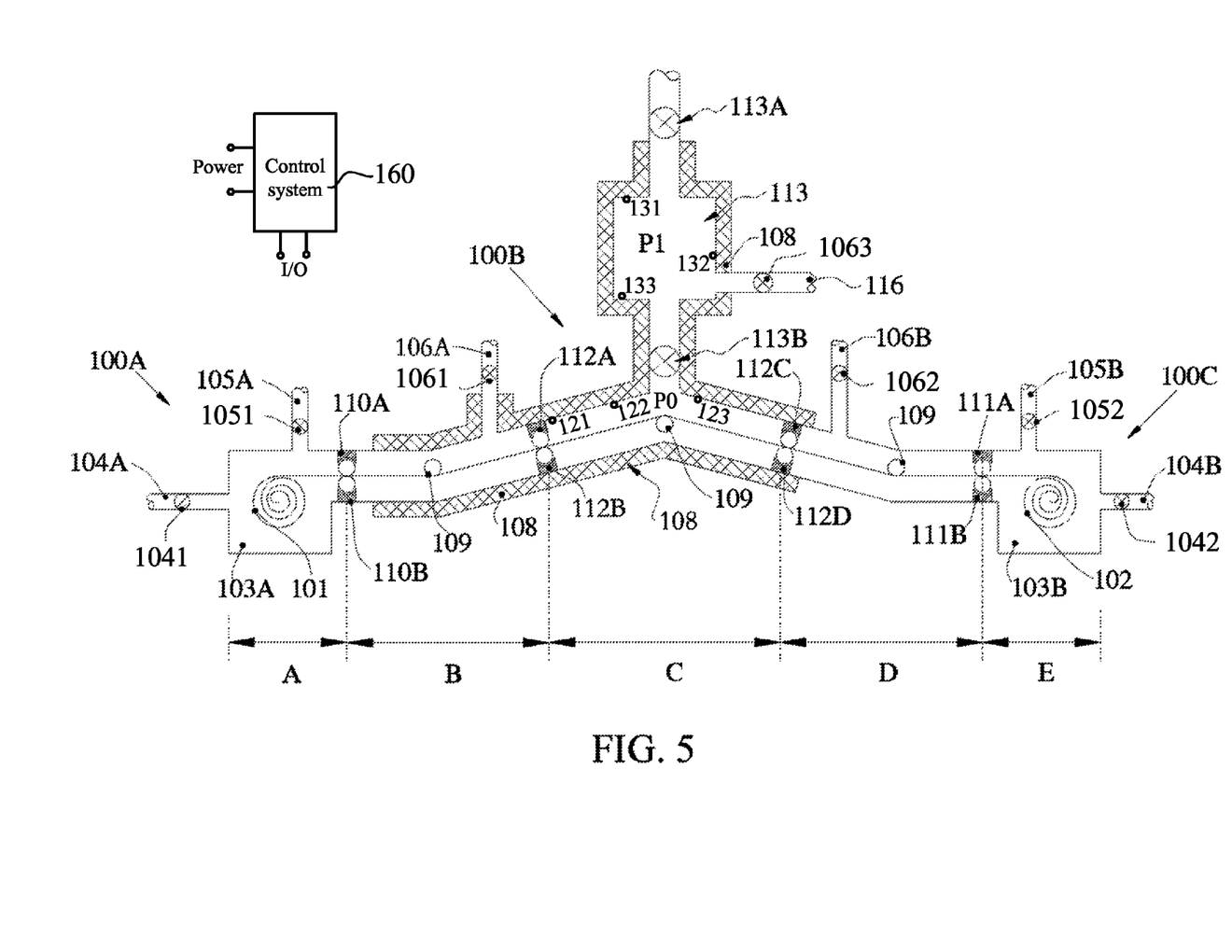
FIG. 5 is a schematic diagram of a reaction apparatus for manufacturing an absorbing layer of a CIGS-based thin film solar cell provided in Embodiment 3 of the present invention.

This embodiment differs from Embodiment 1 by some features described in FIG. 5. As shown in FIG. 5, the reaction channel is disposed in an angular form including first ascending portion, an apex or corner, and then a descending portion. Preferably, the angle of the ascending/descending portion of the reaction channel is set between 15° and 45° relative to horizontal line. In an embodiment, the ascending and descending portions are laid out in a symmetrical configuration relative to the apex position. The angle of change from ascending portion to the descending portion would be about twice the angle of ascending portion relative to horizontal line. In this way, the flexible substrate generates a plurality of bended corners in the movement direction, and the bended corners may absorb the linear expansion quantity generated in the flexible substrate reaction process, thereby preventing the surface of the flexible substrate from crumpling.

Further, a tension regulating apparatus used for regulating expansion clearance of the flexible substrate is disposed in the reaction channel. The regulating apparatus includes a plurality of regulating rollers 109, each regulating roller 109 is disposed at an inner corner of the reaction channel and presses against the flexible substrate, and each regulating roller 109 is connected with a regulating power element (not shown) controlled by the control system 160 for driving the regulating roller to move radially and adjusting surface tension within the flexible substrate. When the flexible substrate passes through the reaction channel having a temperature step profile across from the pre-heating region B to the reaction region C or from the reaction region C to the cooling region D, the flexible substrate expands, thereby generating linear elongation so that tension forces acting on the flexible substrate are inconsistent. In actual production, the control system 160 is able to use a distance sensor to detect the length change of the flexible substrate so as to trigger the regulation function. The regulating power element located at each corner drives the regulating roller 109 to move in radial direction to adjust and maintain a tension force of the flexible substrate be consistent. In this embodiment, there are totally three regulating rollers 109, and when the flexible substrate is tensioned, the regulating roller 109 located in the middle is driven by the regulating element to move upward, and the regulating rollers 109 located at two sides are driven by the regulating elements to move downward.

Embodiment 4

Figure 6:
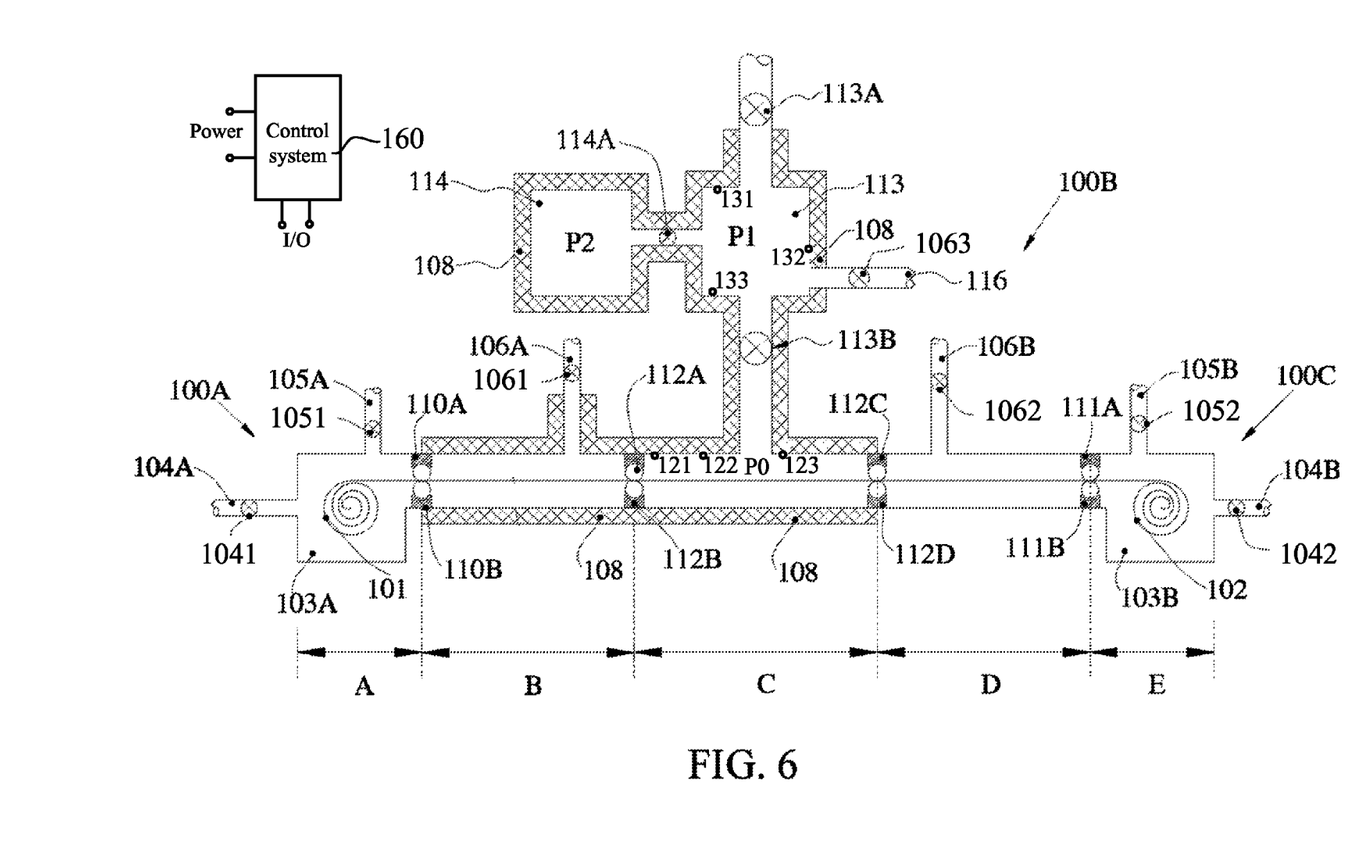
FIG. 6 is a schematic diagram of a reaction apparatus for manufacturing an absorbing layer of a CIGS-based thin film solar cell provided in Embodiment 4 of the present invention.

This embodiment differs from Embodiment 1 by some features described in FIG. 6. As shown in FIG. 6, the gas-balancing chamber 113 is connected with a standby chamber 114. The periphery of the standby chamber 114 is covered with a heating component that is substantially the same as the heating component 108 associated with a thermal insulation material mentioned in Embodiment 1. An outlet valve 114A is disposed on a pipeline through which the standby chamber 114 and the gas-balancing chamber 113 are in communication with each other. The standby chamber 114 contains a certain amount of solid phase Se. When the reactive gas in the gas-balancing chamber 113 is insufficient, the heating component of the standby chamber 114 heats the chamber to evaporate the solid phase Se into a vapor phase. The Se vapor is then supplemented into the gas-balancing chamber 113. Therefore, it is ensured that the gas-balancing chamber 113 performs dynamic balancing and regulation on the reaction chamber 100B, thereby ensuring that the selenization reaction between the preset (precursor) metal layer and selenium-containing reactive gas is substantially uniform within the reaction chamber 100 so that the semiconductor absorbing material is evenly formed on the flexible substrate.

Embodiment 5

Figure 7:
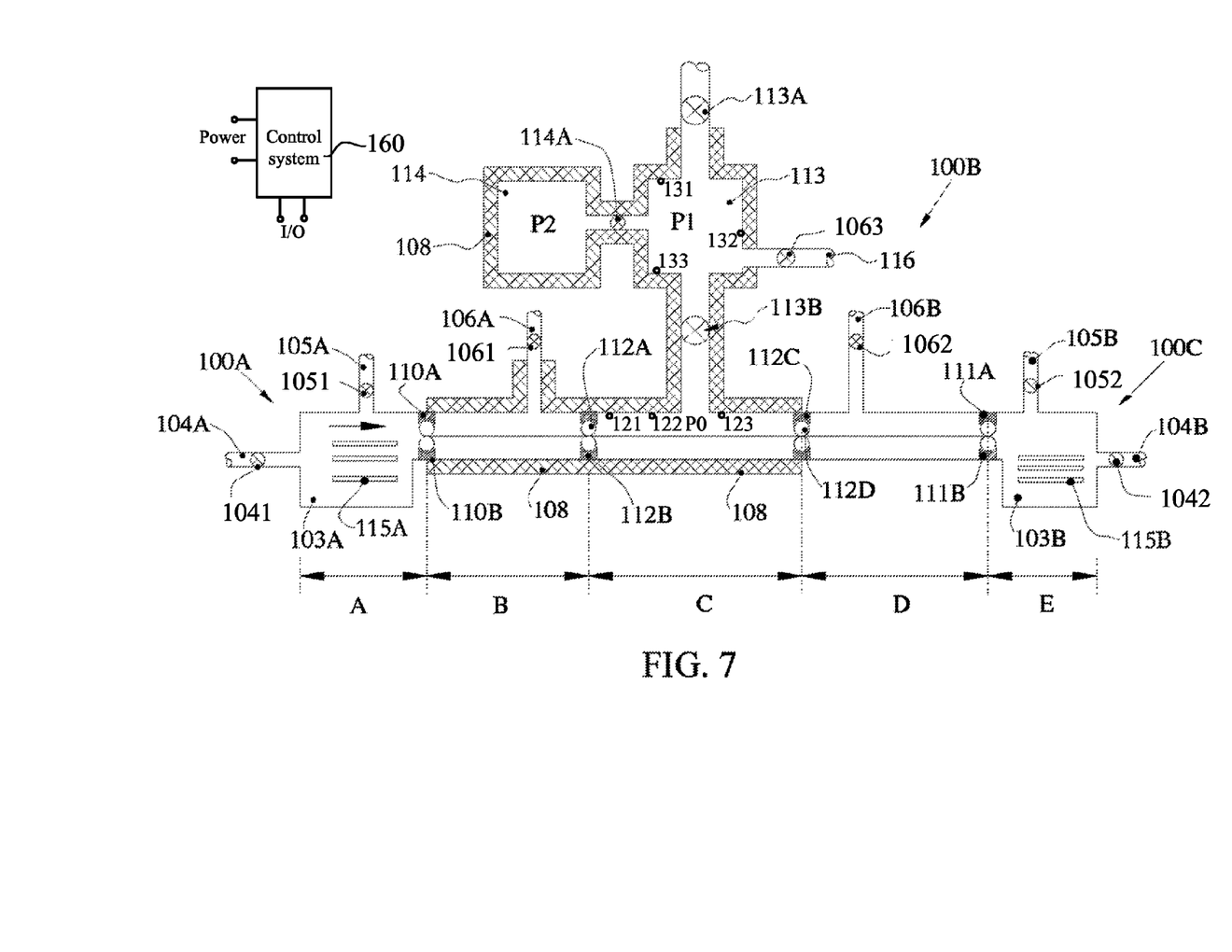
FIG. 7 is a schematic diagram of a reaction apparatus for manufacturing an absorbing layer of a CIGS-based thin film solar cell provided in Embodiment 5 of the present invention.

This embodiment differs from Embodiment 4 by some features described in FIG. 7. As shown in FIG. 7, this embodiment provides a reaction apparatus for manufacturing a CIGS-based absorber material of a thin film solar cell by means of processing in batches. A laminar substrate 115A deposited with a preset layer is fed and supplied by the supply chamber 100A and transmitted by a conveying belt, an absorber material is formed through the reaction channel in the reaction chamber 100B, and a laminar substrate 115B with the formed absorber material is received in the material receiving chamber 100C.

Embodiment 6

Figure 8:
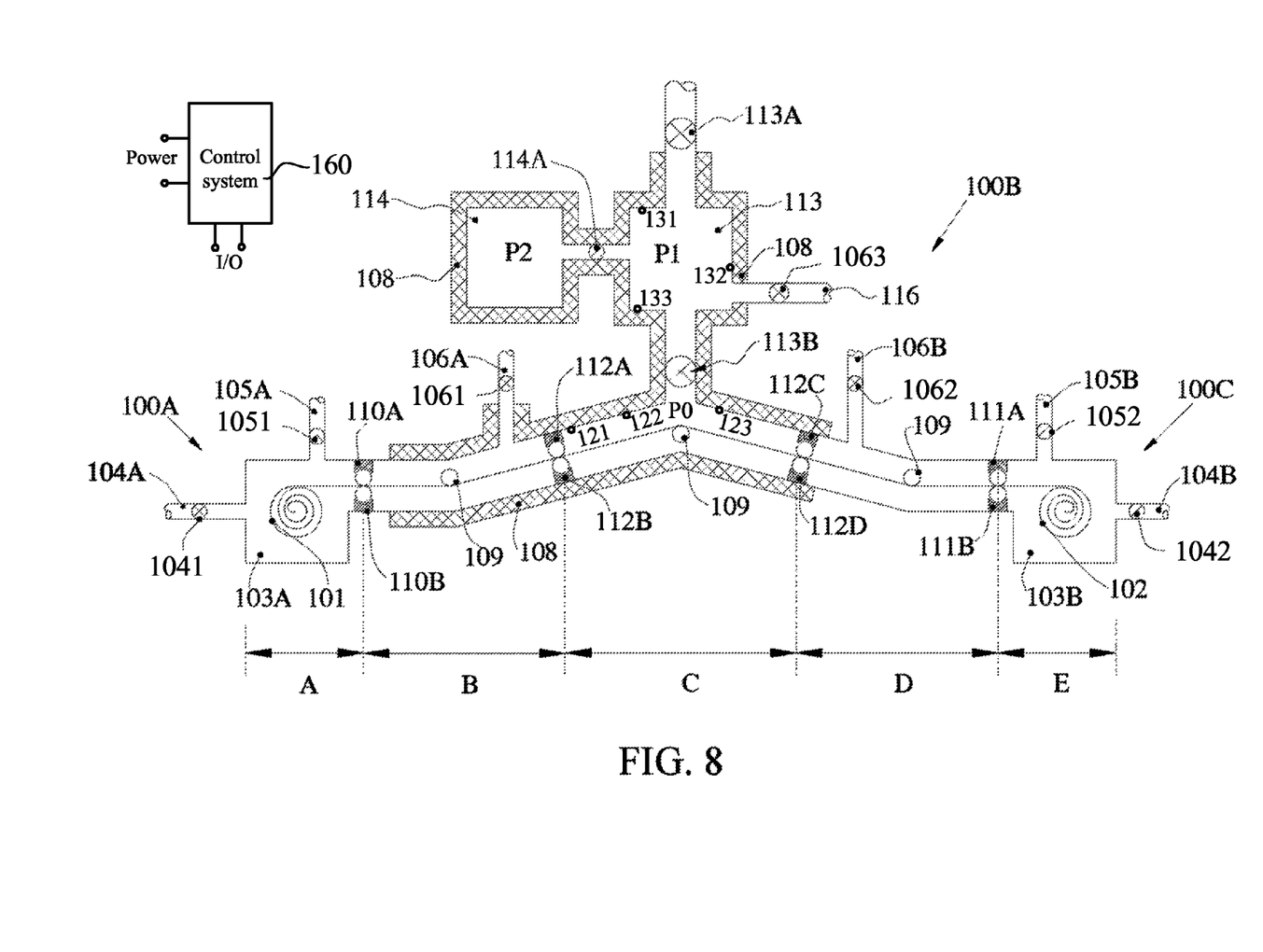
FIG. 8 is a schematic diagram of a reaction apparatus for manufacturing an absorbing layer of a CIGS-based thin film solar cell provided in Embodiment 6 of the present invention.

This embodiment differs from Embodiment 3 by some features described in FIG. 8. As shown in FIG. 8, the gas-balancing chamber 113 is connected with a standby chamber 114, the periphery of the standby chamber 114 is covered with a heating component associated with a thermal insulation material substantially the same the heat component 108 mentioned in Embodiment 1. An outlet valve 114A is disposed on a pipeline through which the standby chamber 114 and the gas balancing chamber are in communication with each other. The standby chamber 114 contains a certain amount of solid phase Se. When the reactive gas in the gas-balancing chamber 113 is insufficient, the standby chamber 114 can be heated by the associated heating component to make the solid phase Se evaporated into a vapor phase Se. The vapor Se is then supplemented into the gas-balancing chamber 113. Therefore, it is ensured that the gas-balancing chamber 113 performs dynamic balancing and regulation on the reaction chamber 100B, thereby ensuring that the selenization reaction between the preset (precursor) metal layer and selenium-containing reactive gas is substantially uniform within the reaction chamber 100 so that the semiconductor absorber material is evenly formed on the flexible substrate.

In an alternative embodiment, the present invention provides a method for manufacturing a CIGS-based absorber material of a thin film solar cell. The method includes following steps for transforming a precursor material into a CIGS-based semiconductor absorber through a reactive selenization process in an apparatus described in one of various embodiments above.

The method includes a step of providing a flexible substrate wound in a roll into a supply chamber, wherein the flexible substrate includes a surface region covered by precursor materials. The precursor materials include a group-IB element, a group-IIIA element and a group-VIA element. In specific embodiments, the precursor materials includes one set of sequentially layered materials selected from Cu/In/Ga/Se, Cu/In/Cu/Ga/Se, Cu—In alloy/Ga/Se, Cu—Ga alloy/In/Se, Cu/In—Ga alloy/Se, Cu/Ga/Cu/In/Se, Cu/Ga/In/Se, Cu—Ga/Cu—In alloy/Se, Cu—Ga alloy/Cu—In/Ga/Se, Cu/Cu—In alloy/Ga/Se, and Cu—Ga alloy/In/In—Ga/Se.

The method further includes a step of providing a reaction chamber sequentially coupled to the supply chamber and further coupled to a receiving chamber as part of an apparatus for forming a CIGS-based semiconductor absorber material. In this apparatus, the supply chamber, the reaction chamber, and the receiving chamber are respectively sealed hermetically and the reaction chamber is further divided into a preheating region, a reaction region, and a cooling region respectively sealed from each other.

In a specific embodiment, the supply chamber, the reaction chamber, and the receiving chamber are respectively coupled to three vacuum pumps to vacuumize correspondingly sealed space to a certain vacuum level characterized by a base pressure ranging from $10^{-7}$ Torr to $10^{-2}$ Torr. Additionally, the method in current application includes a step of back filling one or more types of inert gas, such as $N_2$ or Ar, into the vacuumized space of the chambers mentioned above. Furthermore, the method also includes a step of supplying a reactive gas into the reaction chamber. The reaction chamber, specifically the reaction region, can be pre-heated to a temperature ranging from 350° C. to 650° C. depending on embodiments to cause a selenization reaction between the reactive gas and the precursor materials on the flexible substrate that is continuously transported through the reaction region. The reactive gas includes selenium and/or sulfur bearing gas. The reactive gas reacts with the group-IB element and the group-IIIA element in the precursor materials to form a CIGS-based semiconductor absorber material. In another specific embodiment, the reactive gas containing $H_2S$ gas or a mixed gas of $H_2Se$ and $H_2S$ is introduced into reaction chamber to react with the group-IB element and the group-IIIA element in the precursor materials for forming a CIGS-based semiconductor absorber material.

In another specific embodiment, the step of providing a reaction chamber further includes providing the reaction chamber comprises configuring a horizontal portion of the pre-heating region to couple with the supply chamber and changing the horizontal portion to an ascending portion at a first turning position by a first angle. The step further includes extending the ascending portion of the pre-heating region to an ascending portion of the reaction region up to an apex position and changing the ascending portion of the reaction region to a descending portion of the reaction region at the apex position by a second angle. Additionally, the step includes extending the descending portion of the reaction region to a descending portion of the cooling region and changing the descending portion of the cooling region to a horizontal portion of the cooling region at a second turning position by a third angle. In an embodiment, the first angle is set to a range from 0 degree up to 45 degrees, the second angle is substantially equal to 2× of the first angle, and the third angle is substantially equal to the first angle.

Furthermore, the method includes a step of providing a gas-balancing chamber coupled to the reaction region with a permeation communication and a common thermal control. In this step, Se-bearing gas concentration and pressure inside the reaction region is dynamically balanced with the reactive gas in the gas-balancing chamber through a permeation valve. Both the gas-balancing chamber and the reaction region can be maintained at a same temperature by the common thermal control using a heating component including thermal insulation material.

The method further includes a step of unfolding the flexible substrate from the wound roll in the supply chamber to transport into the reaction chamber for at least subjecting the precursor materials coated on the flexible substrate to a selenization reaction with the Se-bearing reactive gas in the reaction region. In a specific embodiment, when the reaction region is preheated to a temperature above 350° C., Se species existed in the precursor materials may be partially released as Se vapor to join the Se-bearing reactive gas in the reaction region, causing the pressure and concentration of the reactive gas to change.

In a specific embodiment, the method includes a step for maintaining the Se-bearing reactive gas within the gas-balancing chamber at a predetermined state. This step includes maintaining a predetermined pressure using an inlet valve connected to a gas-source, an evacuation valve for exhausting extra gas, and optionally an outlet valve connected to a standby chamber. Each of these valves and the heating component are controlled by a control system which is assisted by receiving one or more feedback information from a plurality of sensor devices disposed within the gas-balancing chamber. The control system is configured to detect the concentration of the reactive gas in the reaction region and compares it with a preset reactive gas concentration. If the detected concentration is found to be lower than the preset value, the reactive gas originated from the gas-balancing chamber permeates into the reaction region through one or more valves; otherwise, the reactive gas in the reaction region permeates back into the gas-balancing chamber. In a specific embodiment, the Se-bearing reactive gas including additional Se vapor in the reaction region is dynamically balanced at the same predetermined state by the permeation valve and the common thermal control during the selenization reaction to transform the precursor materials into a semiconductor absorber substantially uniformly on the flexible substrate that is continuously transported through the reaction region.

Moreover, the method includes a step of transporting the flexible substrate further out of the reaction region to the cooling region to cool the formed semiconductor absorber thereon. A step of cooling the flexible substrate with the formed CIGS-based semiconductor absorber material is executed while the flexible substrate passes through the cooling region.

Finally, the method includes a step of receiving the flexible substrate including the semiconductor absorber in the receiving chamber. The flexible substrate is again wound into a roll.

Through the method, when the CIGS-based semiconductor absorber material is formed through the gaseous chemical reaction, the gas-balancing chamber combined with the control system provides a dynamical regulation of the reactive gas state in the reaction region using multiple valves and the plurality of sensor devices and heating component. As a result, a preset gas standard state is stably maintained to cause a formation of the CIGS-based semiconductor absorber material in a substantially uniform distribution across the flexible substrate throughout the length of the whole roll. As shown, the method uses a combination of steps including providing a wound roll of flexible substrate with specific precursor materials preformed on its surface region, preparing a reaction chamber at proper thermal condition, vacuum condition, and working gas condition (including back-fill inert gas and the reactive gas), coupling the reaction chamber with a gas-balancing chamber, and using a control system to dynamically maintain a stable state of the reactive gas supplied in the reaction chamber to cause the selenization reaction with precursor materials to transform them into a CIGS-based semiconductor absorber material on the flexible substrate. Other alternatives can also be provided where steps are added, one or more steps are removed, or one or more steps are provided in a different sequence without departing from the scope of the claims herein. With the method, manufacture yield and the conversion efficiency of the as formed CIGS-based thin film solar cell are substantially improved.

The foregoing descriptions are merely exemplary embodiments of the present invention, but are not intended to limit the present invention. Thus, while the invention has been described with reference to exemplary embodiments, it should also be appreciated that numerous modifications and alternative embodiments may be devised by those having ordinary skill in the art without departing from the broader and intended spirit and scope of the disclosure as set forth in the claims that follow. Any modifications, equivalent substitutions, and improvements made within the spirit and principle of the present invention shall fall within the protection scope of the present invention. Accordingly, the specification and drawings are to be regarded in an illustrative manner and are not intended to limit the scope of the appended claims.

What is claimed is:

1. An apparatus for manufacturing a CIGS-based absorber material of a thin film solar cell, the apparatus comprising:
    a supply chamber configured to provide a flexible substrate having a surface region coated with one or more precursor materials;
    a reaction chamber coupled to the supply chamber for receiving and heating the flexible substrate in transportation, and subjecting the one or more precursor materials to a reactive gas at a first state to form an absorber material;
    a receiving chamber coupled to the reaction chamber for receiving the flexible substrate with the formed absorber material;
    a gas-balancing chamber filled with the reactive gas at a second state, the gas-balancing chamber being communicated with the reaction chamber for automatically updating the first state of the reactive gas to the second state; and
    a control system coupled at least to the reaction chamber and the gas-balancing chamber to maintain the second state of the reactive gas in the gas-balancing chamber at a preset condition and to adjust the transportation of the flexible substrate through the reaction chamber;
    wherein the reaction chamber is configured to be an elongated channel having a height limited to a range between 3 mm and 30 mm and further comprises at least two pairs of auxiliary rollers for clamping and transporting the flexible substrate at two separate locations in the elongated channel to divide the reaction chamber sequentially into a pre-heating region, a reaction region, a cooling region;
    wherein the elongated channel is configured to start from a horizontal portion of the pre-heating region, change to an ascending portion at a first turning position by a first angle, extend the ascending portion of the pre-heating region to an ascending portion of the reaction region up to an apex position, change the ascending portion of the reaction region to a descending portion of the reaction region at the apex position by a second angle, extend the descending portion of the reaction region to a descending portion of the cooling region, change the descending portion of the cooling region to a horizontal portion of the cooling region at a second turning position by a third angle, the first angle being set to a range from 0 degree up to 45 degrees, the second angle being substantially equal to 2× of the first angle, the third angle being substantially equal to the first angle.

2. The apparatus of claim 1 wherein the gas balancing chamber is connected to the reaction chamber through a gas permeation valve to maintain a dynamic balancing of the first state of the reactive gas in the reaction area with the second state of the reactive gas in the gas-balancing chamber.

3. The apparatus of claim 1 wherein a ratio of the volume of the gas-balancing chamber the reaction chamber is between 1:10 and 10:1.

4. The apparatus of claim 1 further comprising a first plurality of sensor devices disposed in the gas-balancing chamber for providing feedback information for the control system to maintain the second state at a preset condition and a second plurality of sensor devices disposed in the reaction chamber for monitoring the first state being updated to the second state.

5. The apparatus of claim 4 wherein the first/second plurality of sensor devices comprises at least a temperature sensor, a concentration detector, and a pressure sensor.

6. The apparatus of claim 1 further comprising two vacuum pumps separately coupled to the supply chamber and the receiving chamber for determining vacuum conditions therein respectively associated with the flexible substrate with one or more precursor materials and the flexible substrate with the formed absorber material.

7. The apparatus of claim 1 wherein the pre-heating region is coupled to the supply chamber via a pair of inlet transmission rollers configured for clamping two sides of the flexible substrate in a means that is capable of transporting the flexible substrate by a friction force and hermetically sealing between the pre-heating region and the supply chamber, the pair of inlet transmission rollers being respectively driven by two driving elements both controlled by the control system.

8. The apparatus of claim 1 wherein the cooling region is coupled to the receiving chamber via a pair of outlet transmission rollers configured for clamping two sides of the flexible substrate in a means that is capable of transporting the flexible substrate by a friction force and hermetically sealing between the cooling region and the receiving chamber, the pair of outlet transmission rollers being respectively driven by two driving elements both controlled by the control system.

9. The apparatus of claim 1 wherein each pair of auxiliary rollers is configured to hermetically separate the reaction region from either the pre-heating region or the cooling region.

10. The apparatus of claim 1 further comprising a heating component including thermal insulation material configured to wrap around the pre-heating region, the reaction region of the reaction chamber, and the gas-balancing chamber, the pre-heating region being associated with a first temperature, the reaction region being associated with a second temperature, and the gas-balancing chamber being associated a third temperature, the second temperature being set to be greater than the first temperature with a step profile and substantially equal to the third temperature.

11. The apparatus of claim 1 wherein the gas-balancing chamber is connected from above to the apex position of the reaction region to utilize gravity effect.

12. The apparatus of claim 1 further comprising a regulating roller disposed at each one of the first turning position, the apex position, and the second turning position against the flexible substrate during its transportation for regulating substrate tension by causing a radial motion of the regulating roller controlled by the control system.

* * * * *